(12) United States Patent
Chen et al.

(10) Patent No.: US 12,087,648 B2
(45) Date of Patent: Sep. 10, 2024

(54) SEAL RING STRUCTURE WITH ZIGZAG PATTERNS AND METHOD FORMING SAME

(71) Applicant: Taiwan Semiconductor Manufacturing Co., Ltd., Hsinchu (TW)

(72) Inventors: Kuan-Hung Chen, Hsinchu (TW); Hong-Seng Shue, Zhubei (TW); Po-Hao Tsai, Taoyuan (TW); Mirng-Ji Lii, Sinpu Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 62 days.

(21) Appl. No.: 17/659,048

(22) Filed: Apr. 13, 2022

(65) Prior Publication Data

US 2023/0066360 A1    Mar. 2, 2023

Related U.S. Application Data

(60) Provisional application No. 63/237,677, filed on Aug. 27, 2021.

(51) Int. Cl.
| | |
|---|---|
| *H01L 23/10* | (2006.01) |
| *H01L 21/50* | (2006.01) |
| *H01L 21/762* | (2006.01) |
| *H01L 23/522* | (2006.01) |

(52) U.S. Cl.
CPC ............. *H01L 23/10* (2013.01); *H01L 21/50* (2013.01); *H01L 21/76297* (2013.01); *H01L 23/5226* (2013.01)

(58) Field of Classification Search
CPC ..... H01L 23/10; H01L 21/50; H01L 23/5226; H01L 23/585
USPC ........................................................ 257/678
See application file for complete search history.

(56) References Cited

U.S. PATENT DOCUMENTS

| 9,230,920 B2 | 1/2016 | Ishii |
| 11,075,173 B2 | 7/2021 | Tseng et al. |
| 2018/0122754 A1* | 5/2018 | Tatour ................... H01L 23/585 |

FOREIGN PATENT DOCUMENTS

| JP | 2005167198 A | 6/2005 |
| JP | 2014165403 A | 9/2014 |
| KR | 20200050417 A | 5/2020 |

* cited by examiner

*Primary Examiner* — Quoc D Hoang
(74) *Attorney, Agent, or Firm* — Slater Matsil, LLP

(57) ABSTRACT

A method includes forming a plurality of dielectric layers, forming a lower portion of a seal ring including a plurality of metal layers, each extending into one of the plurality of dielectric layers, depositing a first passivation layer over the plurality of dielectric layers, forming an opening in the first passivation layer, forming a via ring in the opening and physically contacting the lower portion of the seal ring, and forming a metal ring over the first passivation layer and joined to the via ring. The via ring and the metal ring form an upper portion of the seal ring. The metal ring includes an edge portion having a zigzag pattern. The method further includes forming a second passivation layer on the metal ring, and performing a singulation process to form a device die, with the seal ring being proximate edges of the device die.

20 Claims, 16 Drawing Sheets

SEAL RING STRUCTURE WITH ZIGZAG PATTERNS AND METHOD FORMING SAME

PRIORITY CLAIM AND CROSS-REFERENCE

This application claims the benefit of the following provisionally filed U.S. Patent application: Application No. 63/237,677, filed on Aug. 27, 2021, and entitled "Innovative Low Stress CuRDL Sealring Structure;" which application is hereby incorporated herein by reference.

BACKGROUND

In wafer-level packaging technology, seal ring structures are formed in the peripheral region of the device dies, and used to provide protection to the circuits encircled by the seal rings. The seal ring may prevent moisture from penetrating into the device dies to degrade the circuits encircled by the seal rings. The seal rings may extend into multiple layers of integrated circuit structure such as low-k dielectric layers and the overlaying passivation layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
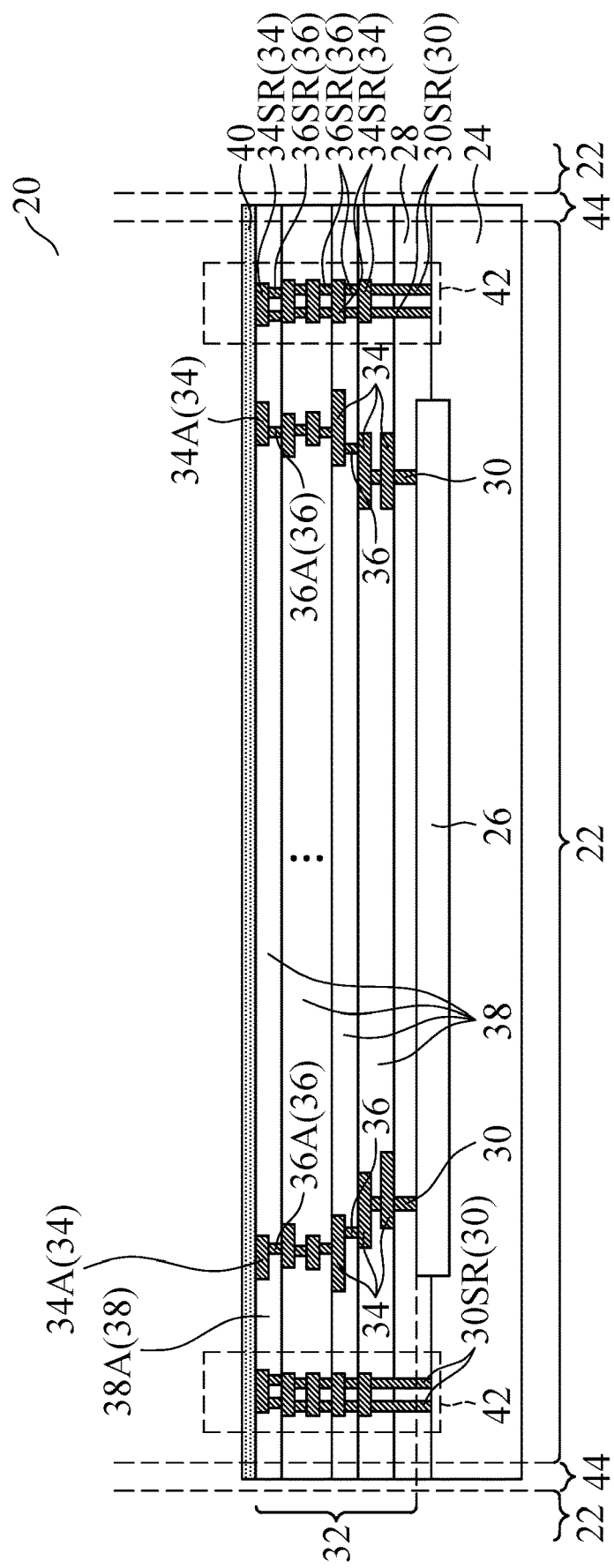
FIGS. 1-8 illustrate cross-sectional views of intermediate stages in the formation of a device die including bent seal rings in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A seal ring and the method of forming the same are provided. In accordance with some embodiments of the present disclosure, the seal ring includes lower portions in low-k dielectric layers, and an upper portion in a passivation layer. The seal ring may include a plurality of sections, with neighboring sections offset from each other to form a zigzag pattern. With the sections offset from each other, the otherwise long sections are broken into shorter sections. Otherwise, a section of seal ring may extend substantially from one edge of the corresponding device die to the opposite edge, and a high stress may be generated in the seal ring and the overlying passivation layer, resulting in cracks and delamination. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 8 illustrate the cross-sectional views of intermediate stages in the formation of a device die and a seal ring therein in accordance with some embodiments of the present disclosure. The corresponding processes are also reflected schematically in the process flow shown in FIG. 19.

FIG. 1 illustrates a cross-sectional view of package component 20. In accordance with some embodiments of the present disclosure, package component 20 is or comprises a device wafer including active devices and possibly passive devices, which are represented as integrated circuit devices 26. The corresponding package component 20 may include a plurality of chips 22 therein, with one of chips 22 being illustrated. In accordance with alternative embodiments of the present disclosure, package component 20 is an interposer wafer, which is free from active devices, and may or may not include passive devices. In accordance with yet alternative embodiments, package component 20 is or comprises a package substrate strip, which includes a core-less package substrate or a cored package substrate with a core therein. In accordance with yet alternative embodiments of the present disclosure, package component 20 is a reconstructed wafer including discrete device dies and a molding compound molding the device dies therein. In subsequent discussion, a device wafer is used as an example of package component 20, and package component 20 may also be referred to as wafer 20. The embodiments of the present disclosure may also be applied on interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may (or may not) be formed to extend into semiconductor substrate 24, wherein the through-vias are used to electrically inter-couple the features on opposite sides of wafer 20.

In accordance with some embodiments of the present disclosure, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers (which are free from active devices), and substrate 24 may be a semiconductor substrate or a dielectric substrate.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of or comprises Phospho Silicate Glass (PSG), Boro Silicate Glass (BSG), Boron-doped Phospho Silicate Glass (BPSG), Fluorine-doped Silicate Glass (FSG), silicon oxide, silicon nitride, silicon oxynitride ($SiO_xN_y$), low-k dielectric materials, or the like. ILD 28 may be formed using spin coating, Flowable Chemical Vapor Deposition (FCVD), Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys therefore, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Metal lines 34 and vias 36 are formed over ILD 28 and contact plugs 30. Contact plugs and the overlying metal lines and vias are collectively referred to as interconnect structure 32. Metal lines 34 and vias 36 are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise carbon-containing low-k dielectric materials, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material in the dielectric layers 38 and then performing a curing process to drive out the porogen, and hence the remaining dielectric layers 38 are porous.

The formation of metal lines 34 and vias 36 in dielectric layers 38 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features such as metal lines, metal pads, or vias (denoted as 34A) in a top dielectric layer (denoted as dielectric layer 38A), which is the top layer of dielectric layers 38. The vias 36 in the top dielectric layer 38A are also denoted as top vias 36A. In accordance with some embodiments, dielectric layer 38A is formed of a low-k dielectric material similar to the material of lower ones of dielectric layers 38. In accordance with other embodiments, dielectric layer 38A is formed of a non-low-k dielectric material, which may include silicon nitride, Undoped Silicate Glass (USG), silicon oxide, or the like. Dielectric layer 38A may also have a multi-layer structure including, for example, two USG layers and a silicon nitride layer in between. Top metal features 34A may also be formed of copper or a copper alloy, and may have a dual damascene structure or a single damascene structure. Dielectric layer 38A is sometimes referred to as a top dielectric layer.

Figure 19:
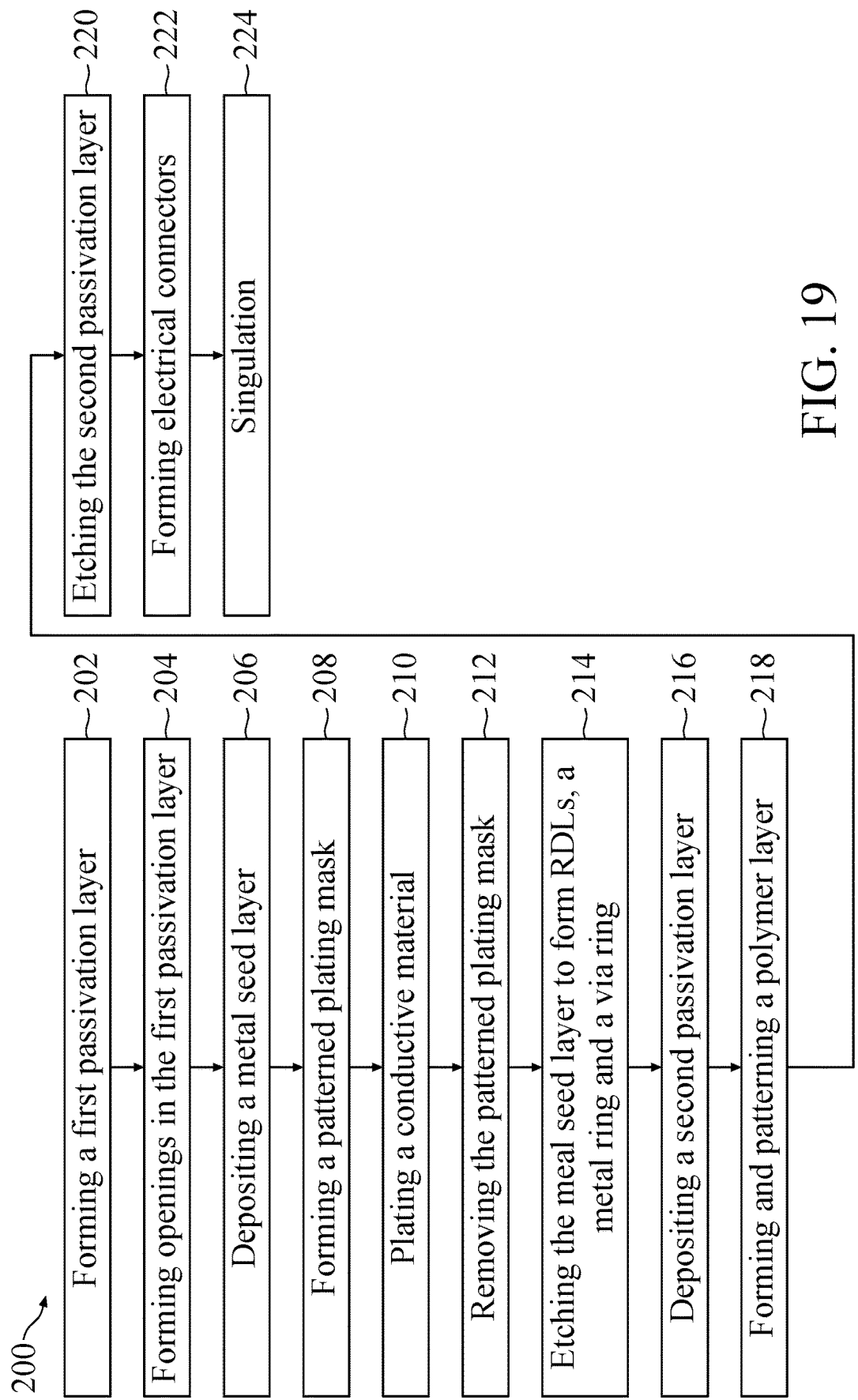
FIG. 19 illustrates a process flow for forming a seal ring in accordance with some embodiments.

Passivation layer 40 (sometimes referred to as passivation-1 or pass-1) is formed over interconnect structure 32. The respective process is illustrated as process 202 in the process flow 200 as shown in FIG. 19. In accordance with some embodiments, passivation layer 40 is formed of a non-low-k and dense dielectric material having a dielectric constant equal to or greater than the dielectric constant of silicon oxide. Passivation layer 40 may be formed of or comprise an inorganic dielectric material, which may include a material selected from, and is not limited to, silicon nitride ($SiN_x$), silicon oxide ($SiO_2$), silicon oxy-nitride ($SiON_x$), silicon oxy-carbide ($SiOC_x$), or the like, combinations thereof, and/or multi-layers thereof. The value "x" represents the relative atomic ratio. In accordance with some embodiments, the top surfaces of top dielectric layer 38A and metal lines 34A are coplanar. Accordingly, passivation layer 40 may be a planar layer. In accordance with alternative embodiments, the top conductive features protrude higher than the top surface of the top dielectric layer 38A, and passivation layer 40 is non-planar.

Figure 10:
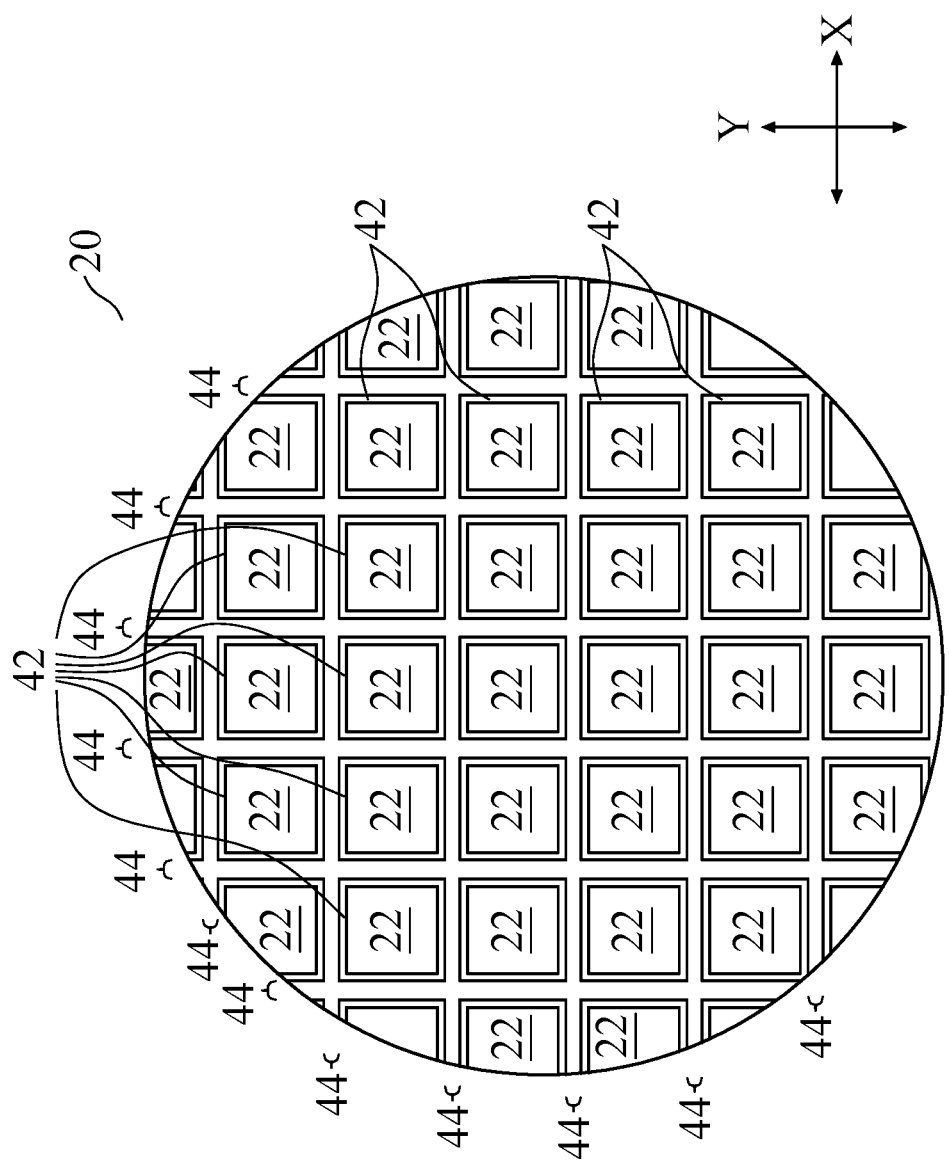
FIG. 10 illustrates a top view of a device wafer, and device dies and seal rings therein in accordance with some embodiments.

FIG. 10 illustrates a top view of wafer 20 and the device dies 22 therein. In accordance with some embodiments, as shown in FIG. 10, each of the device dies 22 includes a seal ring 42. Seal ring 42 is formed as a full ring (without breaks therein) including four sections, with each section being close to one of edges of the corresponding device die 22 and proximate a corresponding scribe line 44. The scribe lines 44 are the regions in wafer 20 and between device dies 22, and the future kerfs generated in the die-sawing of wafer 20 may pass through scribe lines 44.

Referring back to FIG. 1, seal ring 42 includes some contact plugs 30 (which are also denoted as 30SR), some metal lines 34 (which are also denoted as 34SR), and some vias 36 (which are also denoted as 36SR). Contact plugs 30SR, metal lines 34SR, and vias 36SR are formed at the same time and share the same formation processes as the respective other contact plugs 30, metal lines 34, and vias 36 that are used for electrical connections. Each of the contact plugs 30SR, metal lines 34SR, and vias 36SR in seal ring 42 may be physically joined with the overlying and underlying ones of these features to form an integrated seal ring. Each of the contact plugs 30SR, metal lines 34SR, and vias 36SR may form a full ring without break therein when viewed from top.

In accordance with some embodiments, contact plugs 30SR are electrically connected to semiconductor substrate 24. There may be (or may not be) silicide regions between and physically joining contact plugs 30SR and semiconductor substrate 24. In accordance with alternative embodiments, contact plugs 30SR are in physical contact with semiconductor substrate 24. In accordance with yet alternative embodiments, contact plugs 30SR are spaced apart from semiconductor substrate 24 by a dielectric layer such as a contact etch stop layer (underlying ILD 28, not shown), ILD 28, and/or the like.

Figure 2:
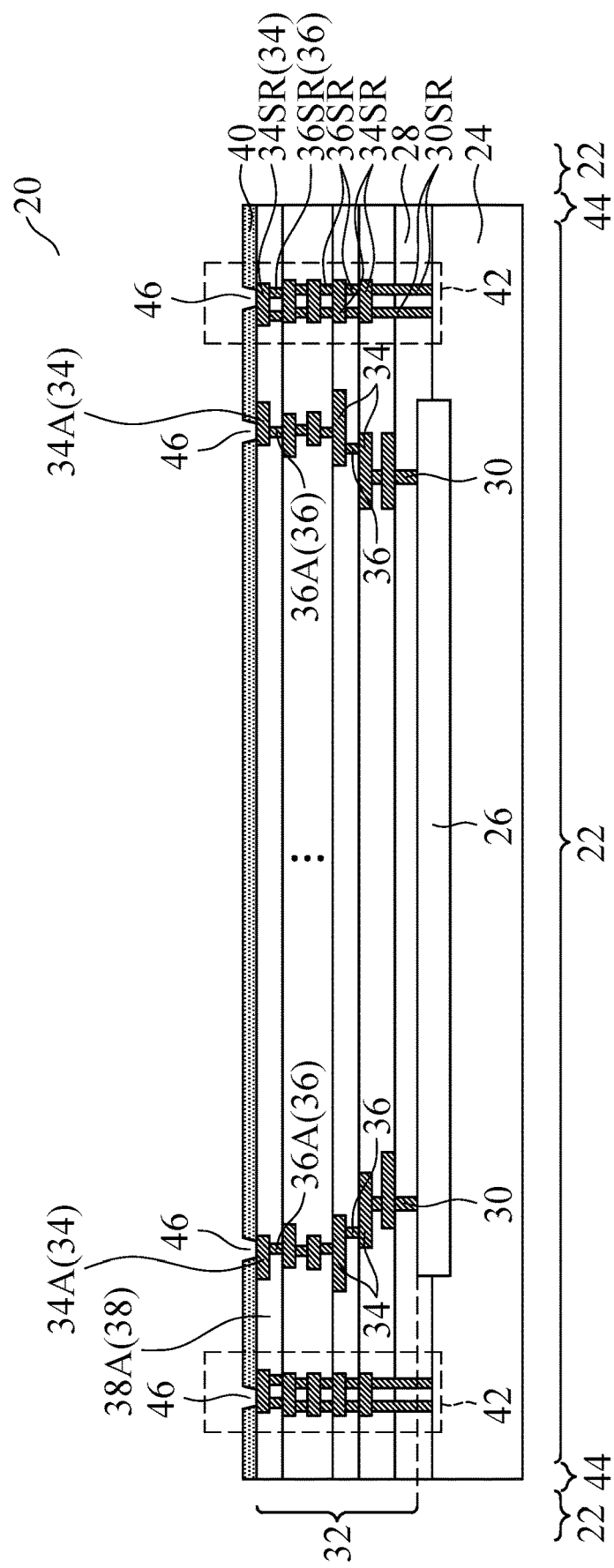

Referring to FIG. 2, passivation layer 40 is patterned in an etching process to form openings 46. The respective process is illustrated as process 204 in the process flow 200 as shown in FIG. 19. The etching process may include a dry etching process, which includes forming a patterned etching mask (not shown) such as a patterned photoresist, and then etching passivation layer 40. The patterned etching mask is then removed. Metal lines 34A and 34SR are exposed through openings 46.

Figure 3:
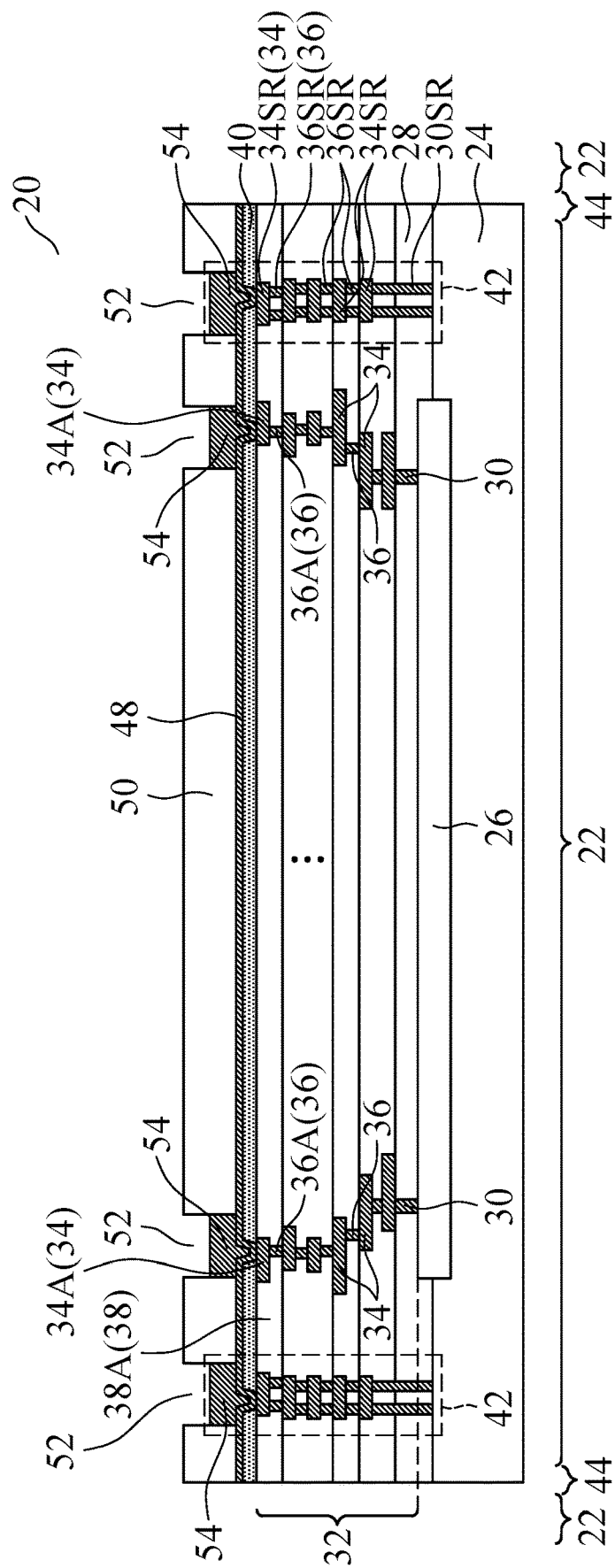

FIG. 3 illustrates the deposition of metal seed layer 48. The respective process is illustrated as process 206 in the process flow 200 as shown in FIG. 19. In accordance with some embodiments, metal seed layer 48 comprises a titanium layer and a copper layer over the titanium layer. In accordance with alternative embodiments, metal seed layer 48 comprises a copper layer in contact with passivation layer 40. The deposition process may be performed using Physical Vapor Deposition (PVD), Chemical Vapor Deposition (CVD), Metal Organic Chemical Vapor Deposition (MOCVD), or the like.

Next, patterned plating mask 50 is formed. The respective process is illustrated as process 208 in the process flow 200 as shown in FIG. 19. In accordance with some embodiments, plating mask 50 is formed of or comprises a photoresist. Openings 52 are formed in the patterned plating mask 50 to reveal metal seed layer 48.

Conductive material (features) 54 is then deposited in openings 52 and on metal seed layer 48. The respective process is illustrated as process 210 in the process flow 200 as shown in FIG. 19. In accordance with some embodiments of the present disclosure, the formation of conductive material 54 includes a plating process, which may include an electrochemical plating process, an electroless plating process, or the like. The plating is performed in a plating chemical solution. Conductive material 54 may include copper, aluminum, nickel, tungsten, or the like, or alloys thereof. In accordance with some embodiments, conductive material 54 comprise copper, and are free from aluminum.

Figure 4:
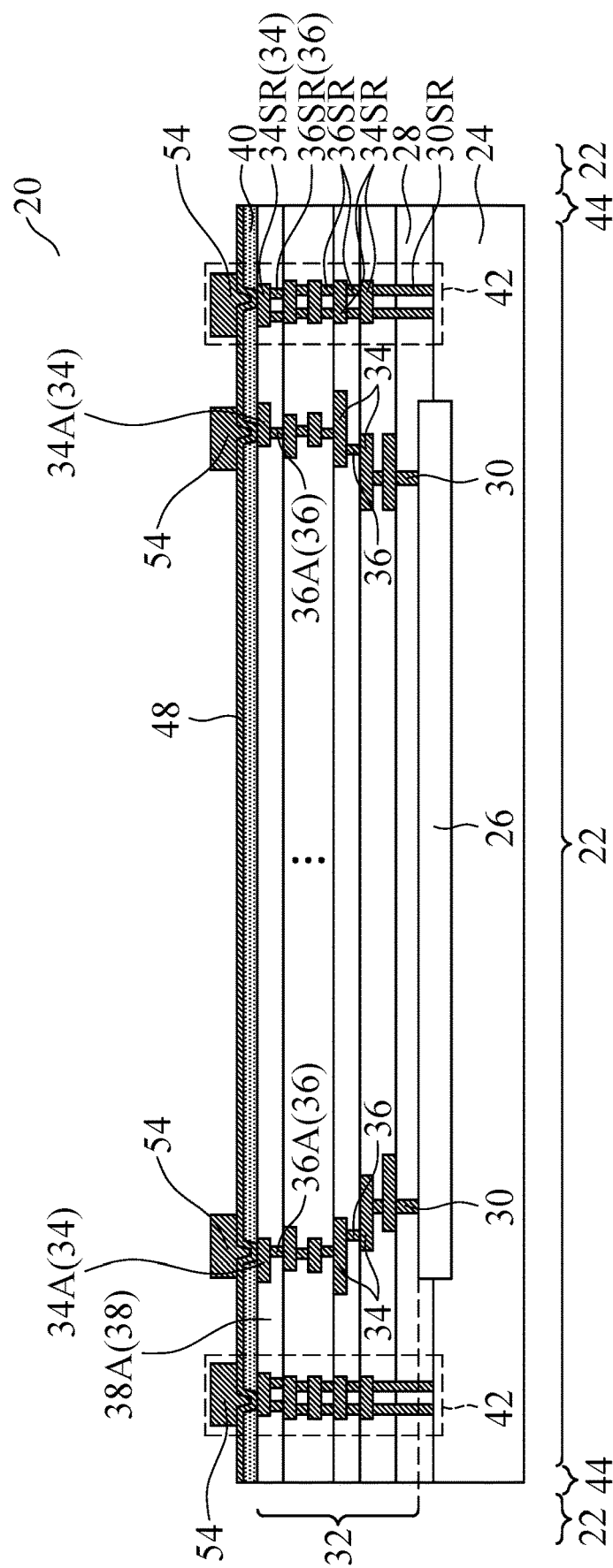
Figure 5:
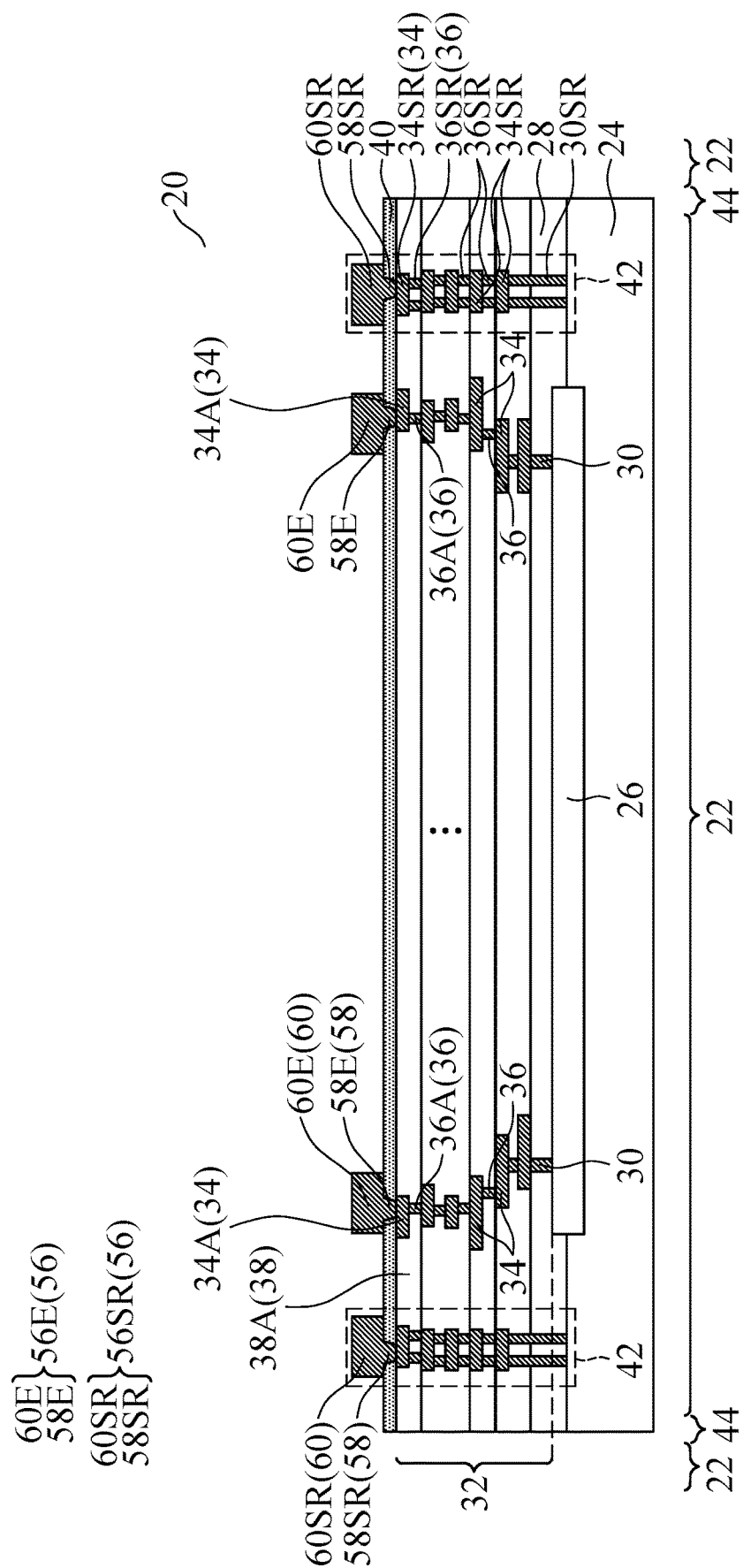

Next, plating mask 50 as shown in FIG. 3 is removed, and the resulting structure is shown in FIG. 4. The respective process is illustrated as process 212 in the process flow 200 as shown in FIG. 19. In a subsequent process, an etching process is performed to remove the portions of metal seed layers 48 that are no longer protected by the overlying conductive material 54. The resulting structure is shown in FIG. 5. The respective process is illustrated as process 214 in the process flow 200 as shown in FIG. 19. Throughout the description, the remaining conductive material 54 and the corresponding underlying metal seed layers 48 are collectively referred to Redistribution Lines (RDLs) 56, which include via portions 58 (also referred to as vias) extending into passivation layer 40, and trace/line portions 60 (also referred to as metal lines) over passivation layer 40.

RDLs 56 includes via ring 58SR and metal ring 60SR, which become an upper portion of seal ring 42. Via ring 58SR is in physical contact with the underlying metal line 34SR. Each of via ring 58SR and metal ring 60SR forms a full ring without break therein, and encircles an inner region of device die 22. RDLs 56 also includes RDLs 56E, which are used for electrical connection. RDLs 56E also includes vias 58E and metal pads/lines 60E, with the vias 58E being physically contacting top metal features 34A.

Figure 6:
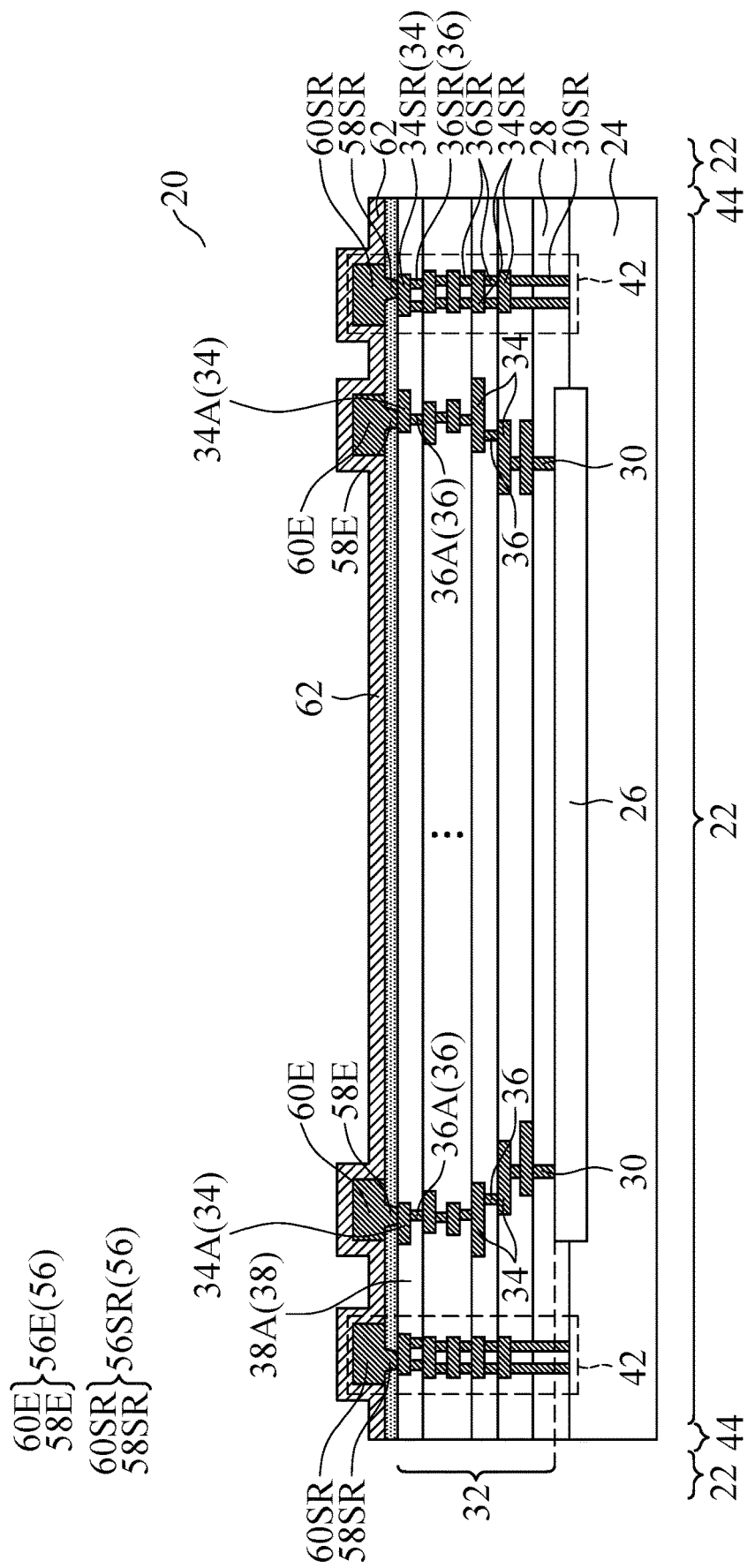

Referring to FIG. 6, passivation layer 62 is deposited. The respective process is illustrated as process 216 in the process flow 200 as shown in FIG. 19. Passivation layer 62 (sometimes referred to as passivation-2 or pass-2) is formed as a blanket layer. In accordance with some embodiments, passivation layer 62 is formed of or comprises an inorganic dielectric material, which may include, and is not limited to, silicon nitride, silicon oxide, silicon oxy-nitride, silicon oxy-carbide, or the like, combinations thereof, or multi-layers thereof. The material of passivation layer 62 may be the same or different from the material of passivation layer 40. The deposition may be performed through a conformal deposition process such as ALD, CVD, or the like. Accordingly, passivation layer 62 may be conformal with the vertical portions and horizontal portions having the same thickness or substantially the same thickness, for example, with a variation smaller than about 20 percent or 10 percent. It is appreciated that regardless of whether passivation layer 62 is formed of a same material as passivation layer 40 or not, there may be a distinguishable interface, which may be visible, for example, in a Transmission Electron Microscopy (TEM) image, an X Ray Diffraction (XRD) image, or an Electron Back Scatter Diffraction (EBSD) image of the structure.

Figure 7:
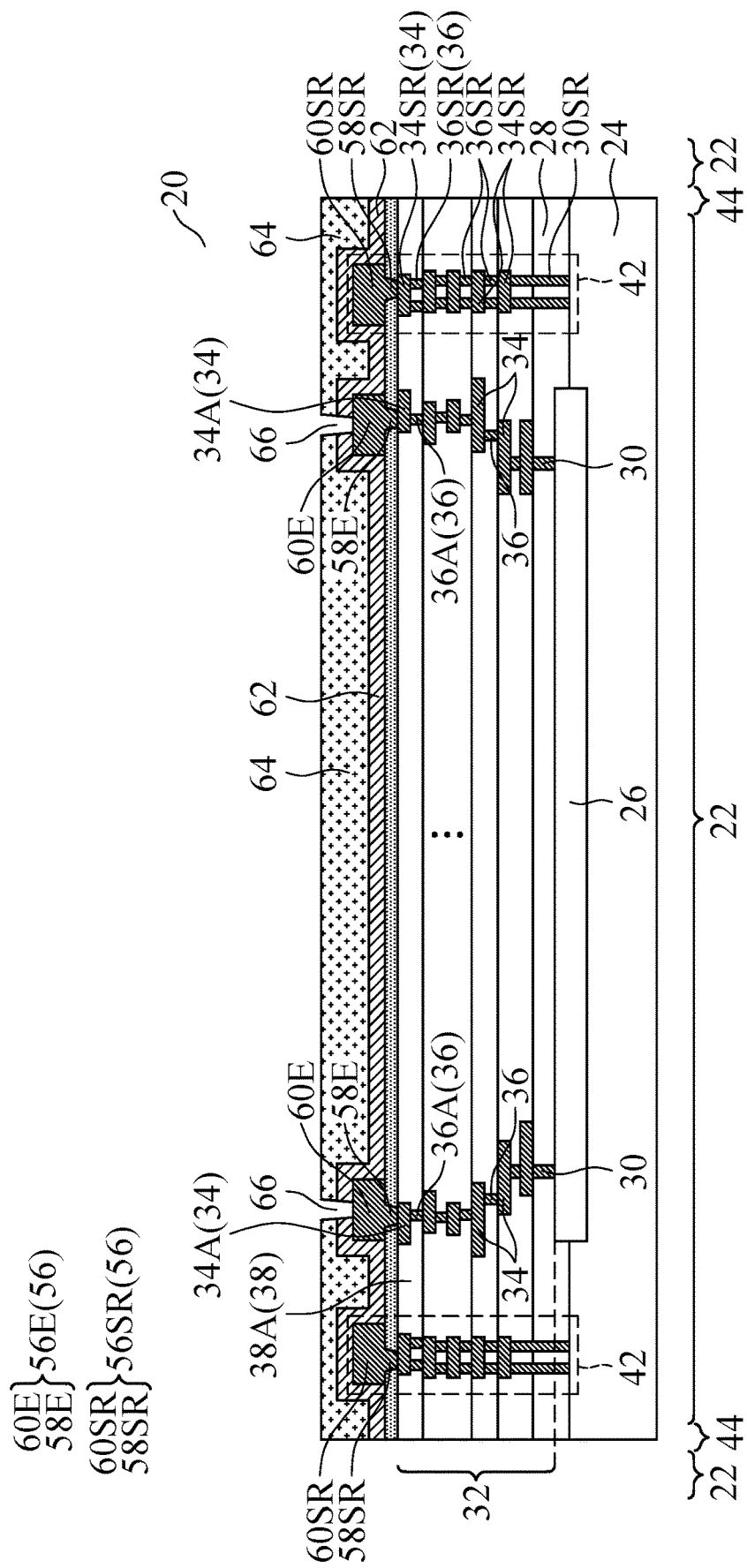

Referring to FIG. 7, polymer layer 64 is dispensed, cured, and patterned, forming openings 66 therein. The respective process is illustrated as process 218 in the process flow 200 as shown in FIG. 19. Polymer layer 64 may include a photo sensitive or non-photo-sensitive polymer. The photo sensitive polymer may comprise polyimide, polybenzoxazole (PBO), benzocyclobutene (BCB), or the like. The patterning of polymer layer 64, when it is photo sensitive, may include performing a photo-exposure process on the polymer layer 64, and then developing polymer layer 64 to form opening 66. In accordance with alternative embodiments in which polymer layer 64 is non-photo-sensitive, for example, when polymer layer 64 comprises a non-photo-sensitive epoxy/ polymer, the patterning of polymer layer 64 may include applying and patterning a photoresist over the polymer layer 64, and etching the polymer layer 64 using the patterned photoresist to define patterns of openings.

Passivation layer 62 is then patterned in an etching process to extend openings 66 down, so that the underlying metal pads 60E are exposed. The respective process is illustrated as process 220 in the process flow 200 as shown in FIG. 19. In accordance with some embodiments, the etching process is performed through a Reactive Ion Etching (RIE) process. The etching gas may include a carbon-and-fluorine-containing gas, argon, oxygen ($O_2$), and nitrogen ($N_2$). There may not be any opening formed to reveal seal ring 42.

Figure 8:
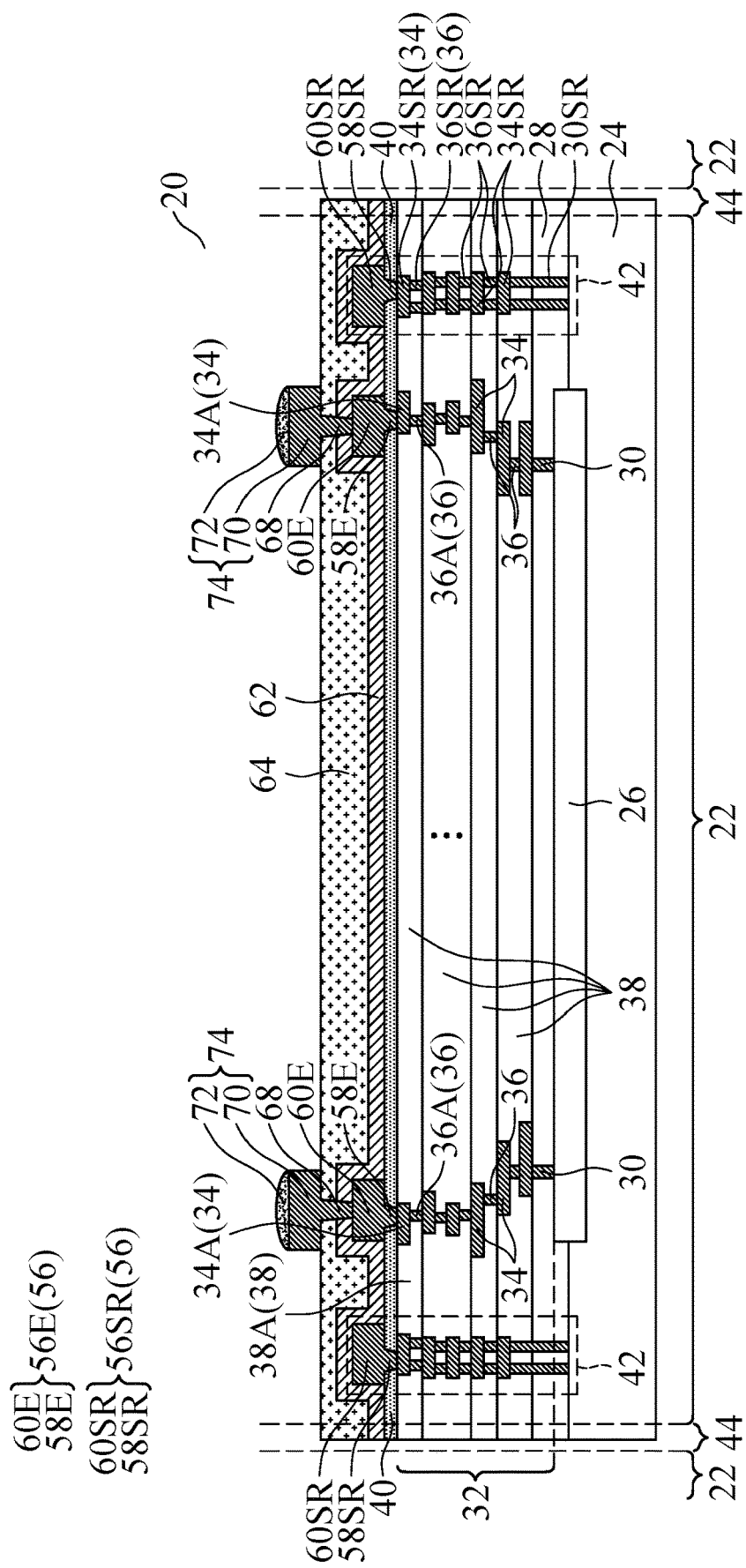

FIG. 8 illustrates the formation of electrical connectors 74 and vias 68. The respective process is illustrated as process 222 in the process flow 200 as shown in FIG. 19. In accordance with some embodiments, the formation process includes depositing a blanket metal seed layer (not shown) extending into openings 66, forming a patterned plating mask, and plating a conductive material into the openings in the plating mask. In accordance with some embodiments, the metal seed layer includes a titanium layer and a copper layer over the titanium layer. Alternatively, the metal seed layer is a single copper layer. The plated conductive material may comprise copper, nickel, palladium, aluminum, lead-free solder, alloys thereof, and/or multi-layers thereof. The plating mask is then removed, followed by an etching process to remove the portions of the metal seed layer not covered by the plated conductive material, thus forming vias 68 and electrical connectors 74. FIG. 8 illustrates an example in which electrical connectors 74 includes metal pillars 70 and solder regions 72. A reflow process is performed to reflow solder regions 72. In some embodiments, the electrical connectors 74 may be micro bumps or controlled collapse of chip connection (C4) bumps.

In accordance with some embodiments, as shown in FIG. 8, electrical connectors 74 have their bottoms in physical contact with the metal lines/pads 60E, which are underlying passivation layer 62. In accordance with alternative embodiments, more redistribution lines, which are post-passivation interconnects, may be formed between metal lines/pads 60E and electrical connectors 74. Accordingly, correspondingly, seal ring(s) 42 may include more metal rings and via rings over and joined to metal ring 60SR, which metal ring and via ring extend to the same layers as the post-passivation interconnects.

In a subsequent process, wafer 20 is singulated, for example, sawed along scribe lines 44 (Also refer to FIG. 10) to form discrete package components 22. The respective process is illustrated as process 224 in the process flow 200 as shown in FIG. 19. Although package components 22 are device dies 22 in accordance with some example embodiments, package components 22 may also be interposers, package substrate, packages, or the like.

In subsequent processes, device die 22 may be bonded with another package component, such as an interposer, a package substrate, a printed circuit board, a package, or the like. The electrical connectors 74 in device die 22 may be bonded to the other package component through solder bonding. An underfill (not shown) may be dispensed between device die 22 and the other package component.

Figure 9:
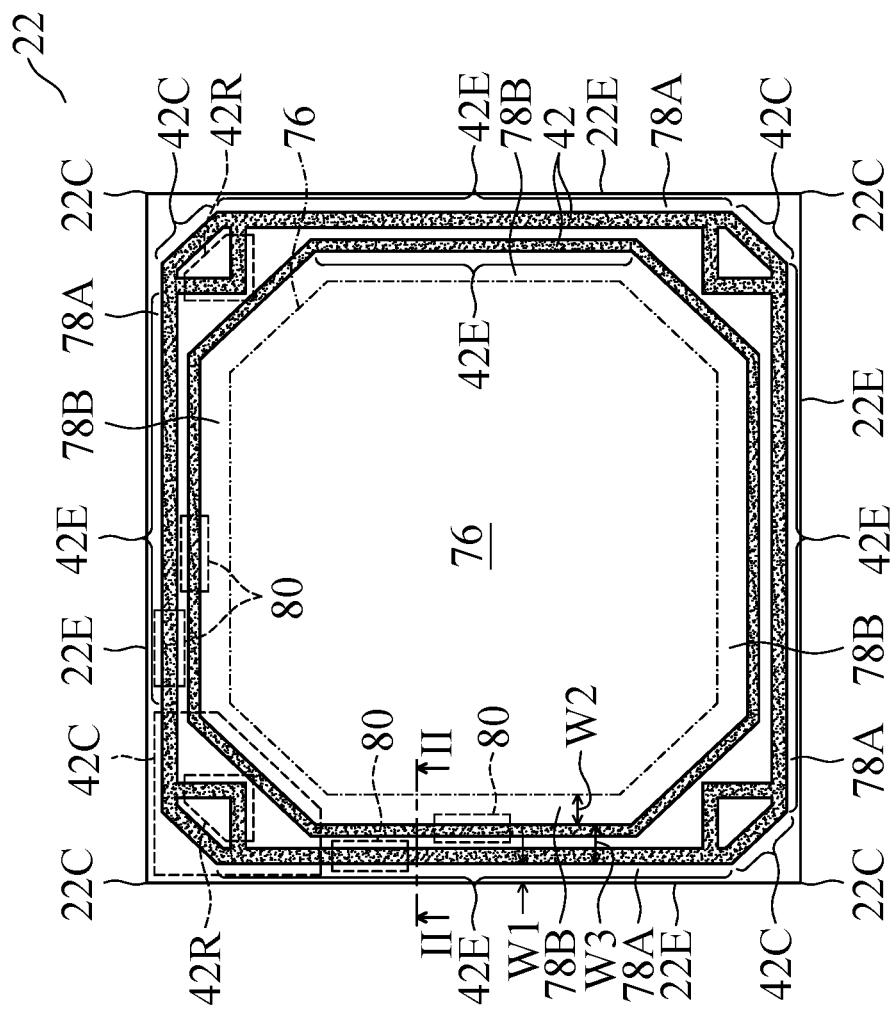
FIG. 9 illustrates a top view of a device die and seal rings therein in accordance with some embodiments.

FIG. 9 illustrates a top view of device die 22 in accordance with some embodiments. Device die 22 has edges 22E and corners 22C. There may be a single seal ring 42 or a plurality of seal rings 42 formed proximate the peripheral of the device die 22, with the outer seal rings 42 encircling the respective inner seal ring 42. The following discussion may refer to one of the seal rings such as the outer seal ring 42 as an example, and the discussion also applies to other seal rings 42. Each of seal ring 42 may include four edge portions/sections 42E, which are parallel to the nearest edges 22E, and four corner portions 42C, which interconnect neighboring edges portions 42E. In accordance with some embodiments, seal ring 42 may include some portions 42R at the corners of device die 22 as reinforcement structures.

Seal ring(s) 42 encircle inner region 76, which is used for forming integrated circuit devices 26 (FIG. 8) and interconnect structures 32. Seal ring 42 may be electrically floating, electrically grounded, or may be electrically connected to substrate 24.

Device die 22 includes outer zones 78A (refer to FIG. 11) extending from the outer sides of the outmost seal ring 42 to the corresponding nearest edge 22E of device die 22. The outer zones 78A are also referred to as sacrificial dummy zones since these zones may be cut-through (although they are intended not to be cut) during the singulation of wafer 20, if the singulation process has higher-than-expected deviation. In accordance with some embodiments, the width W1 of the sacrificial dummy zone 78A may be greater than about 2.7 μm. The large width W1 leaves enough space for polymer layer 64 (FIG. 8) to have enough landing area on passivation dielectric layer 62, so that the adhesion of polymer layer 64 to passivation layer 62 is strong enough. Width W1 may also be in the range between about 5 μm and about 10 μm.

As shown in FIG. 9, inner zones 78B (also refer to FIG. 11) are located between the innermost seal ring 42 and inner region 76, and the inner zones 78B are sometimes referred to as seal ring enhancement zones. The width W2 (FIGS. 9 and 11) of the seal ring enhancement zone 78B may be in the range between about 4 μm and about 8 μm. The nearest distance between seal ring 42 and its closet RDL in the interconnect structure and metal lines may be greater than 4 μm to avoid violating design rules.

Figure 11:
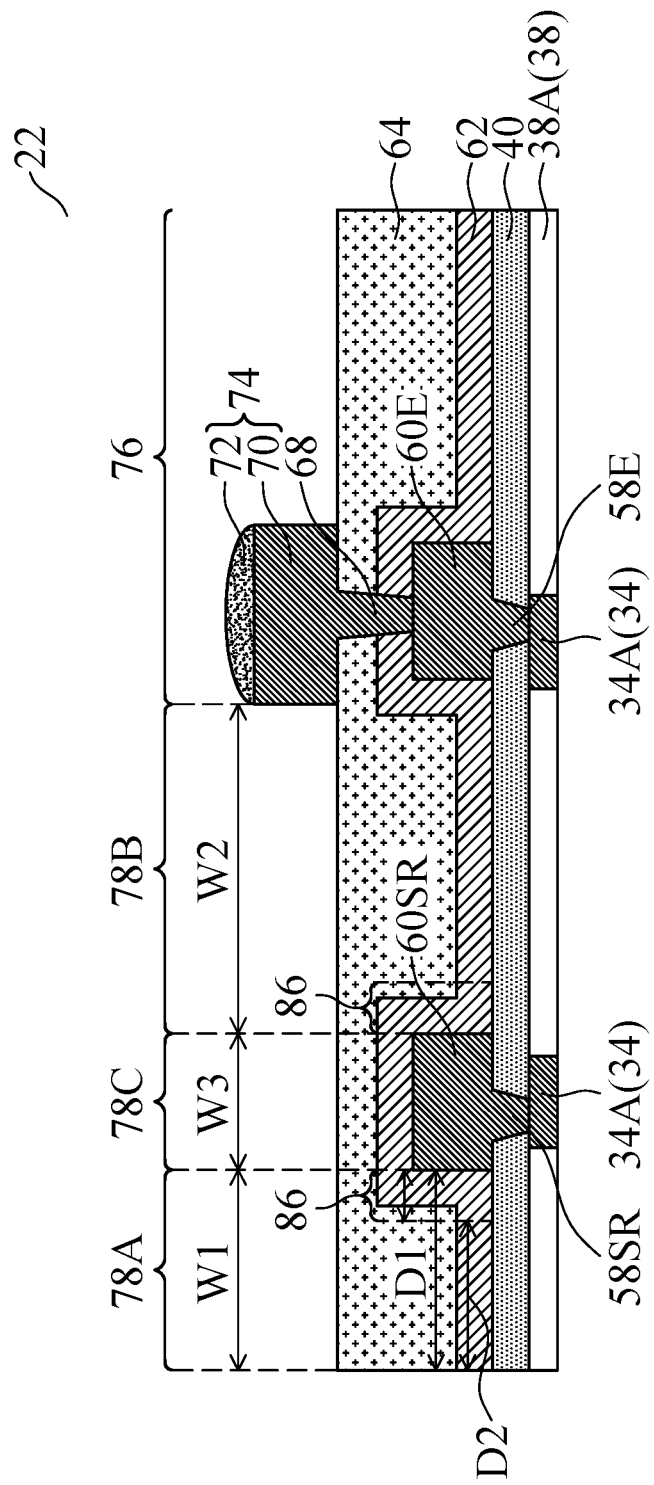
FIG. 11 illustrates a magnified view of an edge portion of a device die in accordance with some embodiments.

The zones occupied by the seal ring(s) and the zones between the seal rings (when more than one seal ring is formed) are collectively referred to as seal ring zones 78C (refer to FIG. 11). In accordance with some embodiments, the width W3 of the seal ring zones may be in the range between about 4.5 μm and about 9 μm.

FIG. 10 illustrates a top view of wafer 20 and the device dies 22 in wafer 20. Scribe lines 44 are formed to separate device dies 22 from each other. Accordingly, after the singulation process, the seal rings 42 in the discrete device dies 22 are close to the edges of device dies 22.

FIG. 11 illustrates a magnified cross-sectional view of an edge portion of a seal ring 42, with a single seal ring 42 illustrated as an example. The cross-sectional view may be obtained from cross-section 11-11 in FIG. 9 (except FIG. 9 shows two seal rings 42, while FIG. 11 shows one seal ring 42). The width W1 of the sacrificial dummy zone 78A, width W2 of seal ring enhancement zone 78B, and width W3 of seal ring zone 78C are marked.

Figure 12:
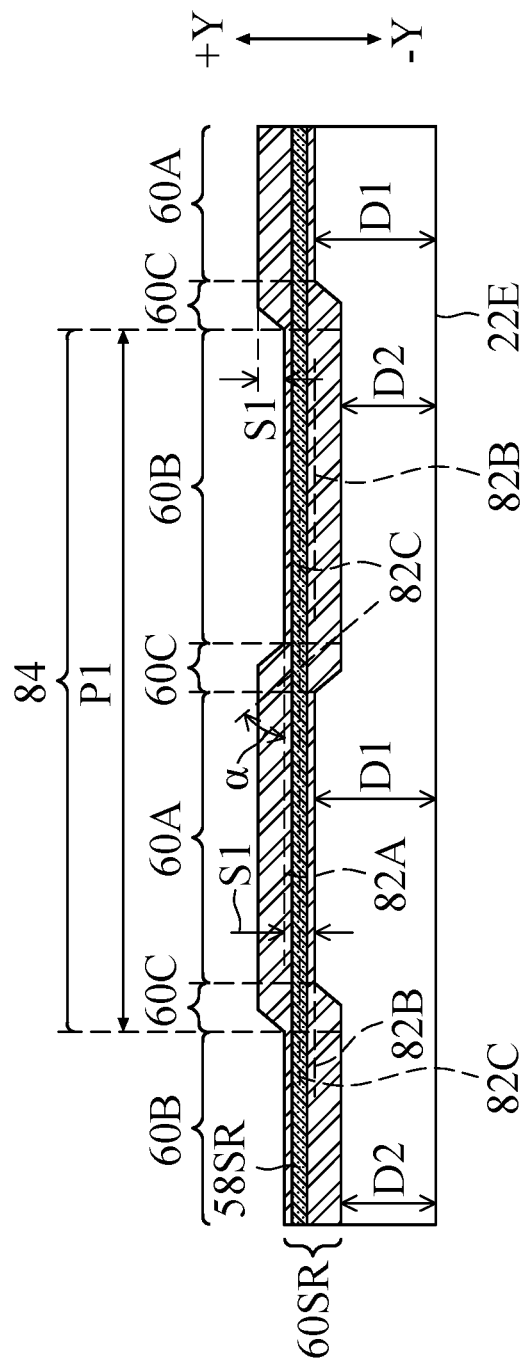
FIGS. 12-17 illustrate the bent portions of seal rings in accordance with some embodiments.

FIG. 12 illustrates a top view of a portion of metal ring 60SR and via ring 58SR in accordance with some embodiments. The illustrated portion may be in regions 80 in FIG. 9. In accordance with some embodiments, metal ring 60SR is bent, and may have a zigzag pattern. Metal ring 60SR includes a plurality of sections 60A and 60B. Throughout the description, the extending directions of the edges and middle lines of the sections are referred to as the extending directions of the corresponding sections. Sections 60A and 60B are elongated strips having their lengthwise directions parallel to each other, and parallel to the nearest edge 22E of the corresponding device die 22. Sections 60A and 60B are offset from each other. For example, sections 60A and 60B swing from each other with swing range S1. Sections 60A and 60B have middle lines 82A and 82B, respectively. Throughout the description, swing ranges may be measured from the corresponding outer or inner edges of the sections of seal ring 42, or may be measured from the middle lines of the sections of seal ring 42. In accordance with some embodiments, swing range S1 is greater than about 0.1 µm, and may be in the range between about 0.5 µm and about 2.5 µm.

Alternatively stated, metal ring 60SR may include a plurality of sections (including 60A and 60B) that have different distances from the respective edges 22E of device die 22. For example, FIG. 12 illustrates that sections 60A and 60B are spaced apart from the edge 22E of device die 22 by distances D1 and D2, respectively.

Sections 60A and 60B are interconnected through interconnection sections 60C, which have extending directions that are not parallel to sections 60A and 60B. In accordance with some embodiments, the extending directions of interconnection sections 60C are neither parallel to nor perpendicular to the extending directions of sections 60A and 60B. In accordance with alternative embodiments, the extending directions of interconnection sections 60C are perpendicular to the extending directions of sections 60A and 60B. In accordance with some embodiments, the angle α between interconnection sections 60C and their joining interconnections 60A and 60B may be in the range between about 30 degrees and about 90 degrees, such as in the range between about 30 degrees and about 60 degrees. The angle α may also be around 45 degrees in accordance with some embodiments.

In accordance with some embodiments, the sections including sections 60A and 60B and two interconnection sections 60C form a repeating unit 84. As shown in FIG. 9, device die 22 includes four edge sections 42E. Each of the edge portions 42E may be formed by serially joining a plurality of repeating units 84. In accordance with some embodiments, the plurality of repeating units 84 are identical to each other. In accordance with alternative embodiments, at least some of the plurality of repeating units 84 are different from each other. For example, the pitches/lengths, angles α, swing ranges, etc., of some repeating units 84 may be different from other repeating units 84.

In accordance with some embodiments, as shown in FIG. 12, the repeating unit 84 has pitch P1, which may also be equal to their lengths. It has been found that the value of pitch P1 affects the reliability and the function of seal ring 42. Since the edge sections 42E (FIG. 9) of seal ring 42 can be long, with their lengths being close to the lengths of the device die 22, the stress generated in the seal rings due to the thermal expansion and contraction may be significantly high. The high stress may result in the cracking of metal ring 60SR (FIGS. 8 and 11) and passivation layer 62. The stress may also cause the delamination between metal ring 60SR and passivation layer 62. By forming metal ring 60SR as being bent, the otherwise long sections become shorter sections, and the stress is reduced.

The magnitude of the stress is related to the pitch P1 of repeating unit 84, and the greater pitch P1 is, the higher stress will be resulted. It has been found that if the pitch P1 exceeds a threshold value such as 90 µm, the stress generated in passivation layer 62 and metal ring 60SR may be too high, and may cause the damage of passivation layer 62 and metal ring 60SR. When pitch P1 is smaller than the threshold value, no damage and delamination have been found. Accordingly, pitch P1 is designed to be smaller than about 90 µm, and may be in the range between about 50 µm and about 80 µm. It is appreciated that the example threshold pitch P1 may be different from 90 µm, for example, when metal ring 60SR and passivation layers 62 and 40 have smaller dimensions such as thickness values and widths.

In accordance with some embodiments, the edge sections in via ring 58SR is not bent, and may be a long-and-straight section extending from one corner section 42C to the neighboring corner section 42C. Accordingly, the swinging of the sections of metal ring 60SR may also be considered as swinging relative to the underlying via 58SR (as compared to swinging relative to each other and/or to edges 22E). Regardless of how the sections of metal ring 60SR swing, via ring 58SR is fully overlapped by metal ring 60SR. The edges of the sections of metal ring 60SR may be vertically offset from, or vertically aligned to, the edges of via ring 58SR.

Further referring to FIG. 12, in accordance with some embodiments as shown in FIG. 12, the middle line 82A of section 60A is on a first side (+Y side) of the middle line 82C of the corresponding via 58SR. The middle line 82B of section 60B is on a second side (−Y side) of the middle line 82C of the corresponding via 58SR. The swing S1 may also be equal to the swing of the middle lines 82A and 82B from the middle line 82C.

Figure 13:
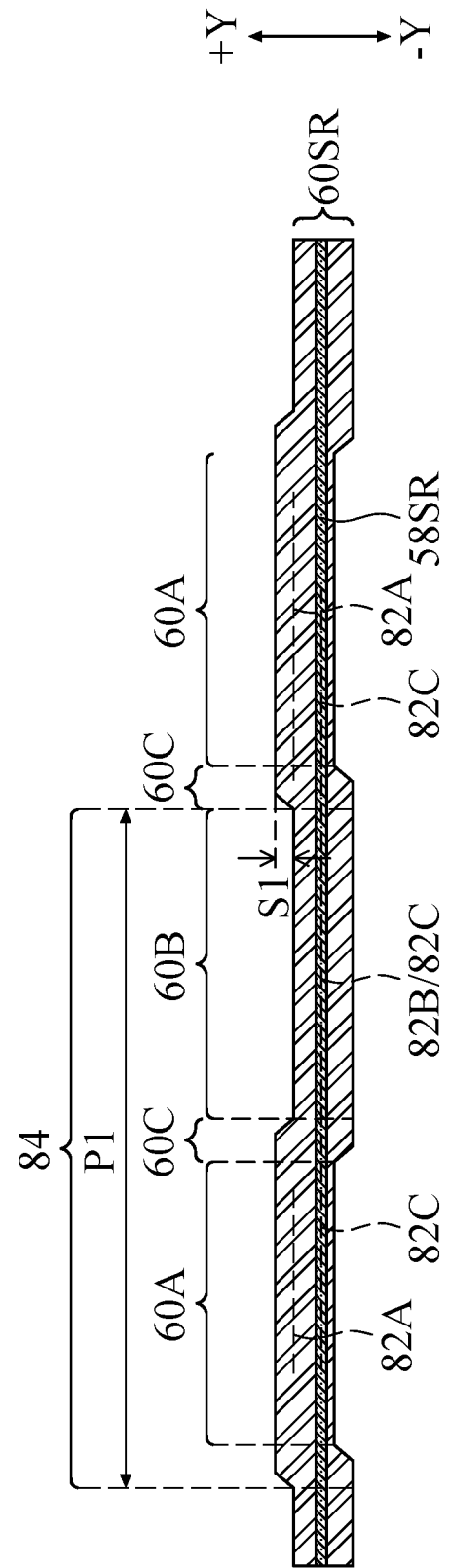

The swinging of metal ring 60SR relative to via ring 58SR as shown in FIG. 12 is a double swing, in which the sections 60A and 60B swing up-and-down (in the +Y direction and −Y direction) relative to via ring 58SR. In accordance with alternative embodiments, the swinging of the sections of metal ring 60SR may be a single swing, as shown in FIG. 13. For example, sections 60A swing in the +Y direction relative to via ring 58SR. Sections 60B, on the other hand, do not swing relative to via ring 58SR, which means that the middle line 80B of sections 60B are aligned to the middle line 80C of the respective underlying portion of via ring 58SR, while the middle lines 80A of section 60A swing away from middle line 80C. The pitch P1 and swing range S1 may be in similar ranges as discussed referring to the embodiments shown in FIG. 12.

Figure 14:
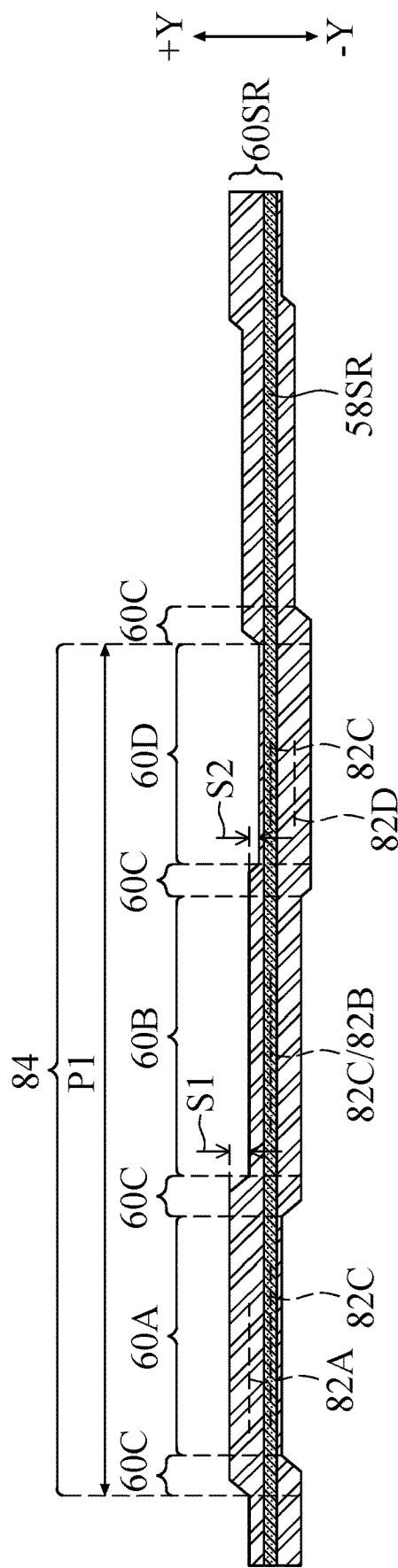

In FIGS. 12 and 13, each of repeating units 84 includes two sections 60A and 60B offset from each other, and further includes two interconnection sections 60C. FIG. 14 illustrates an embodiment in which there are three sections 60A, 60B, and 60D offset from each other, and three corresponding interconnection sections 60C. Section 60A swings in the +Y direction relative to the corresponding via ring 58SR, and relative to section 60B. Sections 60B does not swing relative to via ring 58SR. Section 60D swings in the −Y direction relative to the corresponding via ring 58SR, and relative to section 60B. Similarly, the corresponding middle lines 82A (of sections 60A), 82B (of sections 60B), 82C (of via ring 58SR), and 82D (of sections 60D) are also illustrated. In accordance with some embodiments, middle lines 82A are formed as swinging in the +Y direction relative to middle line 82C, middle line 82B are aligned to middle line 82C, and middle line 82D are formed as swinging in the −Y direction relative to middle line 82C. The pitch P1 and swing ranges S1 and S2 may be similar to the pitch P1 and swing range S1 as discussed referring to FIG. 12.

Figure 15:
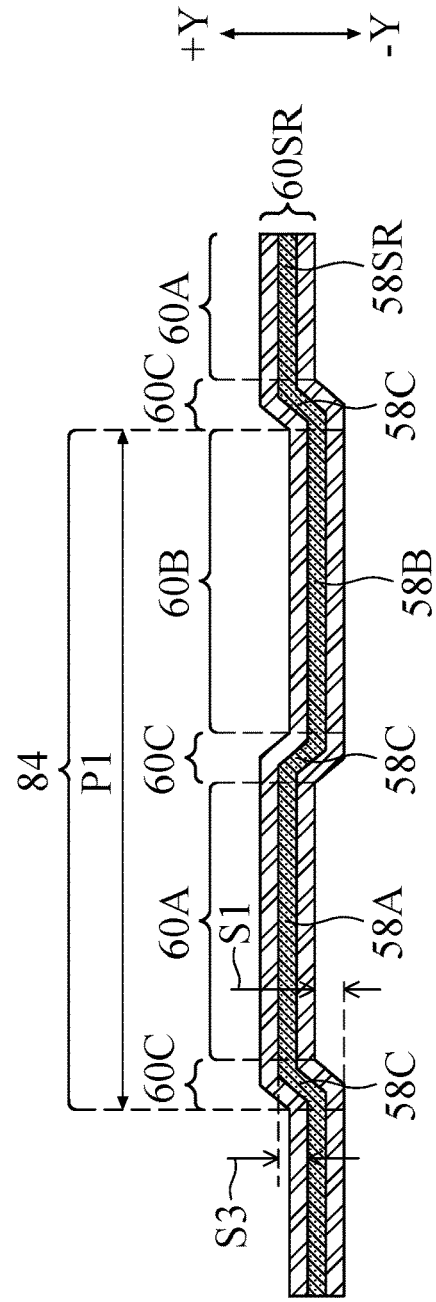

In accordance with the embodiments shown in preceding figures, the edge sections of via ring 58SR are straight without being bent. In accordance with alternative embodiments, the sections of via ring 58SR are also bent as including shorter sections. For example, FIG. 15 illustrates that the metal ring section 60A swings relative to metal ring section 60B, and via ring section 58A swings relative to via ring section 58B. Similarly, via ring section 58A and via ring section 58B are also interconnected by interconnection section 58C. The pitch P1 and swing ranges S1 and S3 may be similar to the pitch P1 and swing range S1 as discussed referring to FIG. 12. In accordance with some embodiments, swing range S1 is equal to swing range S3, and via ring sections 58A and 58B may be aligned to (or may be offset from) the middle of metal ring sections 60A and 60B, respectively. In accordance with alternative embodiments, swing range S1 is different from swing range S3, and the middle line of via ring section 58A may be aligned to the middle line of metal ring section 60A, while the middle line of via ring section 58B is offset from the middle line of metal ring section 60B.

Figure 16:
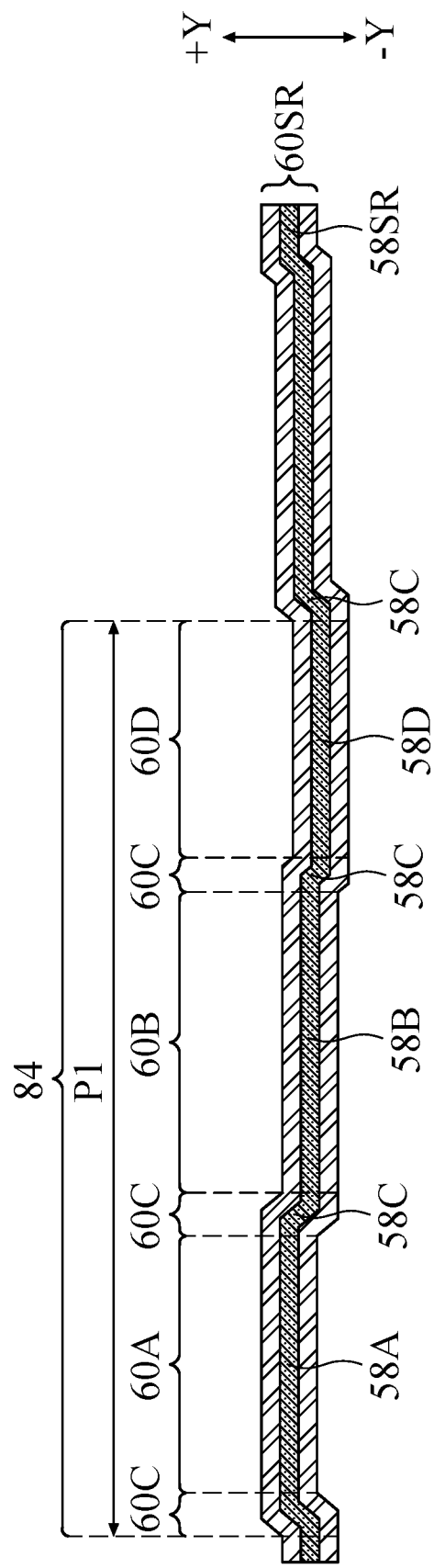

FIG. 16 illustrates an embodiment in which each repeating unit 84 includes three different metal ring sections 60A, 60B, and 60D, which may be all offset from each other, and not limited thereto. Similarly, at least two (or all three) of via ring sections 58A, 58B, and 58D are offset from each other.

Figure 17:
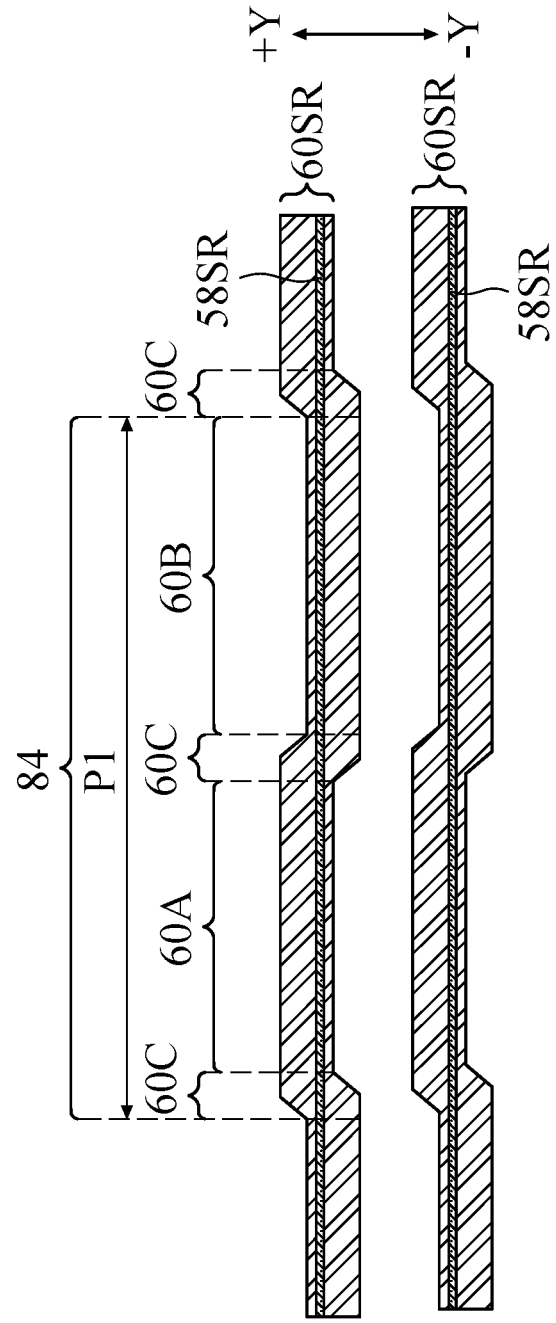

FIG. 17 illustrates an embodiment including two (or more) metal rings 60SR (in different seal rings) whose edge sections are bent. In accordance with some embodiments, the sections in one of the metal rings 60SR are bent in the same directions, and may have same swing ranges as, the nearest section of the other metal ring 60SR. In accordance with alternative embodiments, the sections in one of the metal rings 60SR are bent in different directions, and/or may have different swing ranges as, the nearest section of the other metal ring 60SR. The pitches P1 of the repeating units 84 in different metal rings 60SR may be equal to or different from each other.

Figure 18:
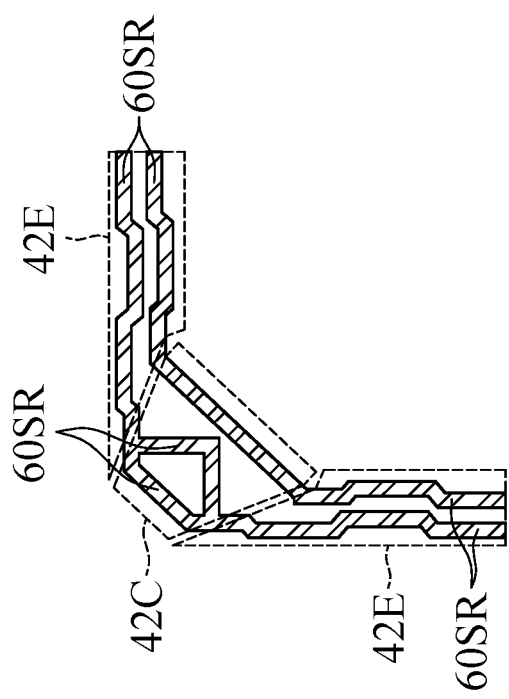
FIG. 18 illustrates straight corner portions of seal rings in accordance with some embodiments.

FIG. 18 illustrates a corner section 42C (also refer to FIG. 9) of one seal ring 42 and the corresponding metal ring sections 60SR. The metal ring section 60SR in corner sections 42C of seal ring 42 may be short, for example, shorter than about 90 µm. Accordingly, the portions of metal ring 60SR in the corner sections 42C may not be bent due to the relatively small stress. In accordance with other embodiments when the corner sections 42C are also long, for example, in very large device dies, the metal ring sections 60SR in corner sections 42C may also be bent. The details of the bending of the corner sections 42C may be essentially the same as shown and discussed referring to FIGS. 12-17, and the details are not repeated herein. The corner portions of via ring 58SR (not shown) may also be straight, or may be bent.

Although the illustrated embodiments use the metal rings in passivation layers as an example, the zigzag/bent patterns may also be used in other layers such as the portions of the seal rings in low-k dielectric layers and the portions of the seal rings in the post-passivation interconnect structure. Furthermore, the using of the zigzag-patterned metal lines to reduce stress may also be used in other long features other than seal rings, such as the RDLs for conducting power or signal, the electrical shielding rings inside package components, or the like. The embodiments may also be applied on other package components other than the device dies. For example, the zigzag-patterned metal lines may be used in the seal rings and the signal/power redistribution structures of integrated fan-out packages, which may be used in large systems (such as Artificial Intelligence (AI) packages) that have very long conductive lines and thus have high stress.

The embodiments of the present disclosure have some advantageous features. By bending metal rings in seal rings, the otherwise long sections are modified as shorter sections. The stress generated in the metal rings and the adjacent passivation layers is reduced. The breakage of the metal rings and the delamination between the seal ring and their neighboring dielectric layers are reduced. These lead to reduced moisture penetration and improved reliability of the resulting package components. Devices and elements in chips 22 are protected from humidity by the seal ring 42.

In accordance with some embodiments of the present disclosure, a method comprises forming a plurality of dielectric layers; forming a lower portion of a seal ring comprising a plurality of metal layers, each extending into one of the plurality of dielectric layers; depositing a first passivation layer over the plurality of dielectric layers; forming an opening in the first passivation layer; forming a via ring in the opening and physically contacting the lower portion of the seal ring; forming a metal ring over the first passivation layer and joined to the via ring, wherein the via ring and the metal ring form an upper portion of the seal ring, and wherein the metal ring comprises a first edge portion having a zigzag pattern; forming a second passivation layer on the metal ring; and performing a singulation process to form a device die, with the seal ring being proximate edges of the device die.

In an embodiment, the first edge portion comprises a plurality of repeating units, with each of the plurality of repeating units comprising a first section and a second section extending in a direction parallel to a nearest edge of the device die, with the first section and the second section having different distance values from the nearest edge of the device die. In an embodiment, the via ring comprises a first portion directly underlying and contacting the first section of the first edge portion of the metal ring; and a second portion directly underlying and contacting the second section of the first edge portion of the metal ring, wherein the first portion and the second portion are aligned to form a straight line.

In an embodiment, the method further comprises dispensing a polymer layer over and contacting the second passivation layer. In an embodiment, the method further comprises forming a via penetrating through the second passivation layer, wherein the via electrically connected to metal lines in the plurality of dielectric layers. In an embodiment, the forming the metal ring and the via ring comprises forming a seed layer extending into the opening; plating a conductive material; and etching a portion of the seed layer un-overlapped by the conductive material. In an embodiment, the metal ring comprises a corner portion interconnecting the first edge portion to a second edge portion of the metal ring, wherein an entirety of the corner portion is straight.

In accordance with some embodiments of the present disclosure, a structure comprises a die comprising a substrate; a plurality of dielectric layers over the substrate; a first passivation layer over the plurality of dielectric layers; a seal ring comprising a plurality of conductive rings, each extending into one of the plurality of dielectric layers; a via ring extending into the first passivation layer and physically contacting a top conductive ring in the plurality of conductive rings; and a metal ring over the first passivation layer and joined to the via ring, wherein the metal ring comprises a first edge portion having a zigzag pattern, wherein the first edge portion is adjacent to an edge of the die; and a second passivation layer over the metal ring.

In an embodiment, the first edge portion comprises a plurality of repeating units, with each of the repeating units comprising a first section and a second section having lengthwise directions parallel to the edge of the die, with the first section and the second section having different distance values from the edge of the die. In an embodiment, the each of the repeating units further comprises an interconnection section interconnecting the first section and the second section. In an embodiment, each of the plurality of repeating units has a pitch smaller than about 90 μm. In an embodiment, the via ring comprises a second edge portion underlying and overlapped by the first edge portion of the metal ring, and the second edge portion of the via ring is straight. In an embodiment, in a top view of the structure, the first edge portion of the metal ring swings relative to the second edge portion of the via ring.

In an embodiment, in the top view, the first edge portion comprises a first section having a first middle line on a first side of a second middle line of the second edge portion of the via ring; and a second section having a third middle line on a second side of the second middle line opposite to the first side. In an embodiment, in the top view, the first edge portion comprises a first section having a first middle line on a side of a second middle line of the second edge portion of the via ring; and a second section having a third middle aligned to the second middle line. In an embodiment, the metal ring further comprises a second edge portion having an additional zigzag pattern; and a corner portion interconnecting the first edge portion and the second edge portion, wherein the corner portion is straight. In an embodiment, the structure further comprises a polymer layer over and contacting the second passivation layer.

In accordance with some embodiments of the present disclosure, a structure comprises a die comprising a first edge and a second edge joined to each other at a corner of the die; a metal ring comprising a first edge portion and a second edge portion proximate the first edge and the second edge, respectively, wherein the first edge portion comprises a first section parallel to the first edge, wherein the first section is spaced apart from the first edge by a first distance; a second section parallel to the first edge, wherein the second section is spaced apart from the first edge by a second distance different from the first distance; and an interconnection section interconnecting, and physically joining, the first section and the second section. In an embodiment, the first section, the second section, and the interconnection section form a repeating unit, and wherein the first edge portion comprises a plurality of additional repeating units identical to the repeating unit. In an embodiment, the structure further comprises a via ring comprising a third section and a fourth section underlying and physically joined to the first section and the second section, respectively, wherein the third section and fourth section are joined with each other to form a straight continuous section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a plurality of dielectric layers;
   forming a lower portion of a seal ring comprising a plurality of metal layers, each extending into one of the plurality of dielectric layers;
   depositing a first passivation layer over the plurality of dielectric layers;
   forming an opening in the first passivation layer;
   forming a via ring in the opening and physically contacting the lower portion of the seal ring;
   forming a metal ring over the first passivation layer and joined to the via ring, wherein the via ring and the metal ring form an upper portion of the seal ring, and wherein the metal ring comprises a first edge portion having a zigzag pattern;
   forming a second passivation layer on the metal ring; and
   performing a singulation process to form a device die, with the seal ring being proximate edges of the device die.

2. The method of claim 1, wherein the first edge portion comprises a plurality of repeating units, with each of the plurality of repeating units comprising a first section and a second section extending in a direction parallel to a nearest edge of the device die, with the first section and the second section having different distance values from the nearest edge of the device die.

3. The method of claim 2, wherein the via ring comprises:
   a first portion directly underlying and contacting the first section of the first edge portion of the metal ring; and
   a second portion directly underlying and contacting the second section of the first edge portion of the metal ring, wherein the first portion and the second portion are aligned to form a straight line.

4. The method of claim 1 further comprising dispensing a polymer layer over and contacting the second passivation layer.

5. The method of claim 1 further comprising forming a via penetrating through the second passivation layer, wherein the via electrically connected to metal lines in the plurality of dielectric layers.

6. The method of claim 1, wherein the forming the metal ring and the via ring comprises:
   forming a seed layer extending into the opening;
   plating a conductive material; and
   etching a portion of the seed layer un-overlapped by the conductive material.

7. The method of claim 1, wherein the metal ring comprises a corner portion interconnecting the first edge portion to a second edge portion of the metal ring, wherein an entirety of the corner portion is straight.

8. A method comprising:
   forming wafer comprising a first die and a second die, wherein the wafer comprises:
     a substrate;
     a plurality of dielectric layers over the substrate; and
     a first passivation layer over the plurality of dielectric layers;
   forming a seal ring in the first die and comprising:
     a plurality of conductive rings, each extending into one of the plurality of dielectric layers; and
       a via ring extending into the first passivation layer and physically contacting a top conductive ring in the plurality of conductive rings; and
     forming a metal ring over the first passivation layer and joined to the via ring, wherein the metal ring comprises a first edge portion having a zigzag pattern, and wherein the first edge portion is adjacent to an edge of the first die; and
   forming a second passivation layer over the metal ring.

9. The method of claim 8, wherein the first edge portion of the first die comprises a plurality of repeating units, wherein the plurality of repeating units comprise a first section and a second section having lengthwise directions parallel to the edge of the first die, with the first section and the second section having different distance values from the edge of the first die.

10. The method of claim 9, wherein the each of the repeating units further comprises an interconnection section interconnecting the first section and the second section.

11. The method of claim 8, wherein the metal ring is plated.

12. The method of claim 8, wherein the via ring comprises a second edge portion underlying and overlapped by the first edge portion of the metal ring, and the second edge portion of the via ring is straight.

13. The method of claim 12, wherein in a top view of the wafer, the first edge portion of the metal ring swings relative to the second edge portion of the via ring.

14. The method of claim 13, wherein in the top view, the first edge portion comprises:
   a first section having a first middle line on a first side of a second middle line of the second edge portion of the via ring; and
   a second section having a third middle line on a second side of the second middle line opposite to the first side.

15. The method of claim 13, wherein in the top view, the first edge portion comprises:
   a first section having a first middle line on a side of a second middle line of the second edge portion of the via ring; and
   a second section having a third middle aligned to the second middle line.

16. The method of claim 8 further comprising sawing the wafer to separate the first die from the second die.

17. The method of claim 8 further comprising dispensing a polymer layer over and contacting the second passivation layer.

18. A method comprising:
   forming a wafer comprising a die therein, the die comprising a first edge and a second edge joined to each other at a corner of the die; and
   forming a metal ring comprising:
      a first edge portion and a second edge portion proximate the first edge and the second edge, respectively, wherein the first edge portion comprises:
         a first section parallel to the first edge, wherein the first section is spaced apart from the first edge by a first distance;
         a second section parallel to the first edge, wherein the second section is spaced apart from the first edge by a second distance different from the first distance; and
         an interconnection section interconnecting, and physically joining, the first section and the second section;
   forming a via ring comprising a third section and a fourth section, wherein after the metal ring is formed, the third section and the fourth section are underlying and physically joined to the first section and the second section, respectively, wherein the third section and fourth section are joined with each other to form a straight continuous section; and
   sawing the wafer along scribe lines adjacent to the first edge and the second edge.

19. The method of claim 18, wherein the first section, the second section, and the interconnection section form a repeating unit, and wherein the first edge portion comprises a plurality of additional repeating units identical to the repeating unit.

20. The method of claim 18, wherein a first lengthwise direction of the interconnection section and a second lengthwise direction of the first section form an angle in a range between about 30 degrees and about 60 degrees.

* * * * *